(12) United States Patent
Min et al.

(10) Patent No.: US 7,132,707 B2
(45) Date of Patent: Nov. 7, 2006

(54) MAGNETIC RANDOM ACCESS MEMORY ARRAY WITH PROXIMATE READ AND WRITE LINES CLADDED WITH MAGNETIC MATERIAL

(75) Inventors: Tai Min, San Jose, CA (US); Yimin Guo, San Jose, CA (US); Pokang Wang, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 203 days.

(21) Appl. No.: 10/910,725

(22) Filed: Aug. 3, 2004

(65) Prior Publication Data

US 2006/0028862 A1   Feb. 9, 2006

(51) Int. Cl.
*H01L 29/76* (2006.01)
*H01L 29/82* (2006.01)
*H01L 23/552* (2006.01)
*H01L 27/20* (2006.01)

(52) U.S. Cl. ............... 257/295; 257/421; 257/659; 257/E27.006

(58) Field of Classification Search ............. 257/295, 257/421, 659, E27.006
See application file for complete search history.

(56) References Cited

U.S. PATENT DOCUMENTS

| | | | |
|---|---|---|---|
| 5,650,958 A | 7/1997 | Gallagher et al. | 365/173 |
| 6,166,948 A | 12/2000 | Parkin et al. | 365/173 |
| 6,211,090 B1 | 4/2001 | Durlam et al. | 438/692 |
| 6,525,957 B1 | 2/2003 | Goronkin et al. | 365/158 |
| 6,593,608 B1 | 7/2003 | Sharma et al. | 257/295 |
| 6,737,691 B1 * | 5/2004 | Asao | 257/295 |
| 6,943,394 B1 * | 9/2005 | Yoshihara et al. | 257/295 |
| 6,979,586 B1 * | 12/2005 | Guo et al. | 438/48 |
| 6,992,342 B1 * | 1/2006 | Motoyoshi et al. | 257/295 |
| 7,002,831 B1 * | 2/2006 | Matsuoka et al. | 365/97 |
| 2003/0151079 A1 | 8/2003 | Jones et al. | 257/295 |
| 2003/0207486 A1 | 11/2003 | Deak | 438/33 |

OTHER PUBLICATIONS

"A 0.18μm Logic-based MRAM Technology for High Performance Nonvolatile Memory Applications," by A.R.Sitaram et al., MRAM Development Alliance, IBM/ Infinear Technologies, IBM Semiconductor Research and Development Center, Hopewell Jctn, NY, USA.
Co-pending "Magnetic Random Access Memory Array With Thin Conduction Electrical Read and Write Lines," U.S. Appl. No. 10/892,668, filed Jul. 16, 2004, assigned to the same assignee.

* cited by examiner

*Primary Examiner*—Luan Thai
(74) *Attorney, Agent, or Firm*—Saile Ackerman LLC; Stephen B. Ackerman

(57) ABSTRACT

An MTJ MRAM cell is formed above or below an intersection of vertically separated, magnetically clad, ultra-thin orthogonal word and bit lines whose thickness is less than 100 nm. Lines of this thickness produce switching magnetic fields at the cell free layer that are enhanced by a factor of approximately two for a given current. The word and bit lines also include a soft magnetic layer of high permeability formed on their surfaces distal from the cell to improve the magnetic field still further. The fabrication of a cell with such thin lines is actually simplified as a result of the thinner depositions and eliminates the necessity of removing material by CMP during patterning and polishing, thereby producing uniform spacing between the lines and the cell free layer.

26 Claims, 3 Drawing Sheets

MAGNETIC RANDOM ACCESS MEMORY ARRAY WITH PROXIMATE READ AND WRITE LINES CLADDED WITH MAGNETIC MATERIAL

RELATED PATENT APPLICATIONS

This Application is related to application Ser. No. 10/892,668, filed on Jul. 16, 2004 and assigned to the same assignee as the present application.

BACKGROUND OF THE INVENTION

1. Field of the Invention

This invention relates to the design and fabrication of magnetic tunnel junctions (MTJ) as memory storage devices, particularly to a design wherein word and bit lines are placed very close to the MTJ and cladded with magnetic material so as to produce higher magnetic flux at the MTJ free layer for a given write current.

2. Description of the Related Art

The magnetic tunnel junction (MTJ) basically comprises two electrodes, which are layers of magnetized ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, because it depends on the availability of tunneling states that accept electrons with different spin orientations. Therefore, the overall tunneling current will depend on the number of spin-up vs. spin-down electrons, which in turn depends on the orientation of the electron spin relative to the magnetization direction of the ferromagnetic layers. Thus, if the relative magnetization directions are varied for a given applied voltage, the tunneling current will also vary. As a result of this behavior of an MTJ, sensing the change of tunneling current for a fixed voltage can enable a determination of the relative magnetization directions of the two ferromagnetic layers that comprise it.

The use of an MTJ as an information storage device requires that the magnetization of at least one of its ferromagnetic layers can be varied relative to the other and also that changes in these relative directions can be sensed by means of variations in the tunneling current or, equivalently, the junction resistance. In its simplest form as a two state memory storage device, the MTJ need only be capable of having its magnetizations put into parallel (low resistance) or antiparallel (high resistance) configurations, when writing data, and of having its tunneling current variations or resistance variations measured, when reading data.

In practice, the free ferromagnetic layer of the MTJ can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of orthogonal current carrying lines called word lines and bit lines. When both lines are carrying current, the device is written upon by having the magnetization direction of its free layer changed. When only one line is carrying current, the resistance of the device can be sensed, so the device is effectively read. Note that an additional current carrying line may be present in some device configurations to sense the resistance of the device, but in simplest terms the device behaves as described above. Such an MTJ device is provided by Gallagher et al. (U.S. Pat. No. 5,650,958), who teach the formation of an MTJ device with a pinned ferromagnetic layer whose magnetization is in the plane of the layer but not free to rotate, together with a free magnetic layer whose magnetization is free to rotate relative to that of the pinned layer, wherein the two layers are separated by an insulating tunnel barrier layer.

In order for the MTJ MRAM device to be competitive, in terms of power consumption and device density, with other forms of DRAM, it is necessary that the MTJ be made very small, typically of sub-micron dimension. Parkin et al. (U.S. Pat. No. 6,166,948) teaches the formation of an MTJ MRAM cell in which the free layer is formed of two antiparallel magnetized layers separated by a spacer layer chosen to prevent exchange coupling but to allow direct dipole coupling between the layers. The free layer thereby has closed flux loops and the two layers switch their magnetizations simultaneously during switching operations. Parkin notes that sub-micron dimensions are needed to be competitive with DRAM memories in the range of 10–100 Mbit capacities. Parkin also notes that such small sizes are associated with significant problems, particularly super-paramagnetism, which is the spontaneous thermal fluctuation of magnetization in samples of ferromagnetic material too small to have sufficient magnetic anisotropy (a measure of the ability of a sample to maintain a given magnetization direction). To overcome the undesirable spontaneous thermal fluctuations in MRAM cells with very small cross-sectional areas, it is necessary to make the magnetic layers thick. Unfortunately, the size of the required switching field increases with layer thickness, so the price paid for a thermally stable cell is the necessity of expending a great deal of current to change the magnetic orientation of the cell's free layer.

Some degree of anisotropy is necessary if an MTJ cell is to be capable of maintaining a magnetization direction and, thereby, to effectively store data even when write currents are zero. As cell sizes have continued to decrease, the technology has sought to provide a degree of magnetic anisotropy by forming cells in a wide variety of shapes (eg. rectangles, diamonds, ellipses, etc.), so that the lack of inherent crystalline anisotropy is countered by a shape anisotropy. Yet this form of anisotropy brings with it its own problems. A particularly troublesome shape-related problem in MTJ devices results from non-uniform and uncontrollable edge-fields produced by shape anisotropy (a property of non-circular samples). As the cell size decreases, these edge fields become relatively more important than the magnetization of the body of the cell and have an adverse effect on the storage and reading of data. Although such shape anisotropies, when of sufficient magnitude, reduce the disadvantageous effects of super-paramagnetism, they have the negative effect of requiring high currents to change the magnetization direction of the MTJ for the purpose of storing data.

One way of addressing the problem of the high currents needed to change the magnetization direction of a free layer when its shape anisotropy is high, is to provide a mechanism for concentrating the fields produced by lower current values. This approach was taken by Durlam et al. (U.S. Pat. No. 6,211,090 B1) who teach the formation of a flux concentrator, which is a soft magnetic (NiFe) layer formed around a copper damascene current carrying line. The layer is formed around three sides of the copper line which forms the digit line at the underside of the MRAM cell.

Deak (U.S. Patent Application Publication No.: U.S. 2003/0207486 A1) discloses an array of MRAM devices formed between word and bit lines that are clad with low remanence (remaining B field after the inducing H field has been reduced to zero) flux concentrators. The remanence thereby serves an advantageous purpose of providing the cell with a biasing magnetic field.

Sharma et al. (U.S. Pat. No. 6,593,608 B1) provides a magnetic memory device having two soft magnetic reference layers (fixed layers) and two barrier layers, wherein the two barrier layers are formed on the soft magnetic reference layers which also play the role of cladding layers.

Goronkin et al (U.S. Pat. No. 6,525,957 B1) provides a MRAM type multi-state memory cell in which magnetic flux is confined within the cell by forming the cell around the current carrying line.

Jones et al. (U.S. Patent Application Publication No.: U.S. 2003/0151079 A1) forms a magnetically clad bit line structure in which the bit line is formed within a trench whose sidewalls contain the magnetic cladding.

This invention addresses the problem of the high current required to reorient the magnetization of the free layer in ultra-small MRAM cells wherein the super-paramagnetic behavior requires thick free layers. It does so by forming composite, ultra-thin word and bit lines, each line of thickness less than 100 nm, each line with an adjacent soft magnetic layer that concentrates the magnetic field at the free layer and each line formed on the same side of the free layer.

SUMMARY OF THE INVENTION

A first object of this invention is to provide an MTJ MRAM cell that makes more efficient use of word and bit line switching currents, the lines thereby producing magnetic fields of sufficient intensity for switching, while requiring lower currents to do so.

A second object of this invention is to provide a method of forming the cell.

A third object of the invention is to provide an array of such cells.

This object will be achieved by an MRAM cell design and fabrication method in which word and/or bit lines are formed of highly conductive materials to an exceptional thinness of less than 100 nm. In addition, the word and bit lines are magnetically clad on a distal surface, i.e., they include a layer of soft (low coercivity) and highly permeable magnetic material formed on a surface that is furthest from the cell. The conducting material can be any of the high conductivity materials such as Al, Cu, Au, Ru, Ta, CuAu, CuAg, NiCr, Rh and multilayers of these materials such as multiple laminations of (NiCr/Cu). The cladding material can be made of Co, Fe, Ni and their alloys, but other low coercivity, highly permeable materials are equally appropriate.

In conventional word and bit lines of the prior art, the aspect ratio (ratio of thickness, t, to width w) of word/bit lines is close to one. Applying simple physics (Ampere's Law) indicates that the magnetic field, Hs, at the surface of a prior art line of comparable thickness, t, and width, w, carrying current I is given by: $H_s = \pi I/w$.

For the proposed ultra-thin word/bit line design, where w>>t, the magnetic field obeys the following relationship: $H_s = 2\pi I/w$. Thus, there is an enhancement of the magnetic field at the wire surface by a factor of two. Since the MRAM cell is located a small distance from the line surface, the benefit will be somewhat reduced, but will still be substantial, particularly since the fabrication method allows the distance between line and cell to be kept uniformly small.

FIG. 1a shows a vertical cross-sectional view of the MTJ MRAM cell of the present invention. The cell element (the multilayered stack formation) is above a vertically separated intersection of an ultra-thin write word line (10) extending in length along the z-axis of the illustrated axes (its width being in the x-direction and its thickness in the y-direction), and an ultra-thin bit line (20) extending in length along the x-axis (its width being in the z-direction and its thickness being in the y-direction) and vertically above the word line. These lines are used to perform write operations on the cell, i.e. to switch the magnetization of its free layer. The write word line and bit lines are separated by between approximately 100 and 1000 angstroms by an insulating layer (15) formed of insulating material such as $Al_2O_3$, $SiO_2$, or SiN, and are also surrounded peripherally by such insulation. The write word and bit lines (hereinafter called simply word and bit lines) have thicknesses, $t_w$ and $t_b$ respectively that are substantially less than their widths, $w_w$ and $w_b$ (not shown) in accord with the objects of the present invention, wherein $t_w$ and $t_b$ are both less than approximately 100 nm and their widths are between approximately 300 and 5000 nm. It is once again noted that word and bit lines of the prior art are formed with comparable widths and thicknesses, both being between approximately 300 and 500 nm. A description of the ultra-thin magnetically clad word or bit line fabrication process will be described more fully below. The word and bit lines both have magnetic layers formed on them, on surfaces distal to the cell, shown here as (12) and (22), the purpose of which is to further concentrate the magnetic fields produced by the lines. An additional conducting electrode (59), sometimes referred to as a read word line, is used to perform read operations on the cell through a conducting connection (60) to an accessing transistor (not shown).

A multilayered MTJ MRAM cell element (50), of substantially circular horizontal cross-section, of thickness between approximately 200 and 400 angstroms and lateral dimension between approximately 0.3 and 0.7 microns, is shown, in vertical cross-section, positioned above the intersection of the word and bit lines, although configurations in which the cell is positioned below the word and bit lines are also possible. In accord with the invention, both the word and bit lines are positioned on the same side of the free layer of the cell element. The cell element is formed on the bit line, with the lower surface of the cell element contacting the upper surface of the bit line. The cell element is a multilayer fabrication comprising a seed layer (51), formed on the bit line, an antiferromagnetic pinning layer (52), a synthetic ferrimagnetic pinned layer which includes a second (53) and first (55) ferromagnetic layer separated by a coupling layer (54), a tunnel barrier layer (56), a free layer (57), which can also be a laminated structure, and a capping layer (58) beneath the bit line. An additional conducting electrode, also called a read word line (59), used in read operations, is formed on the upper surface of the cell. This electrode is used to make contact with an accessing transistor, which is not shown. A detailed description of materials and dimensions used in the cell and in the fabrication process will be discussed below within the description of the preferred embodiment.

DESCRIPTION OF THE PREFERRED EMBODIMENT

Figure 1A:
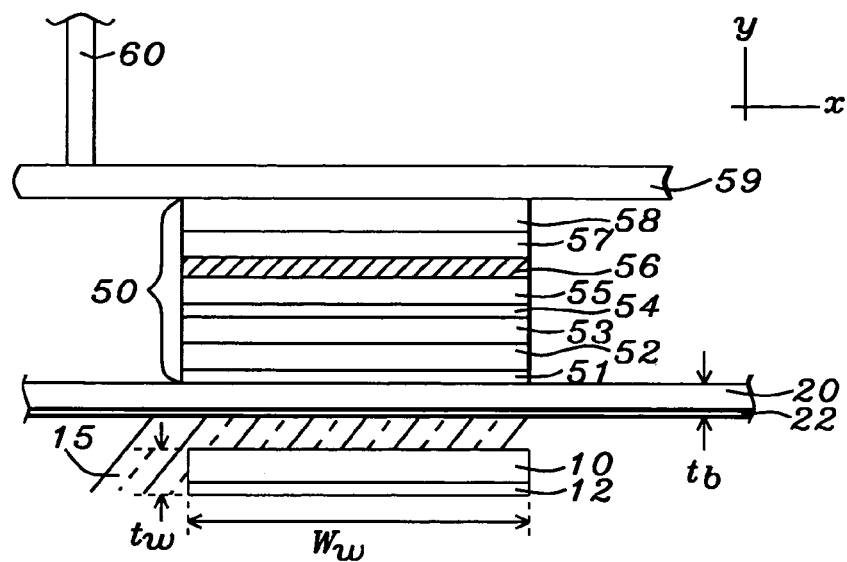
FIG. 1a is a schematic vertical cross-sectional view of an MTJ MRAM cell with a cell element formed above an intersection of the ultra-thin, magnetically clad word and bit lines of the present invention.

The preferred embodiment of the present invention is an MTJ MRAM cell comprising a multilayered cell element formed at an intersection of word and bit lines that are ultra-thin and magnetically clad so that smaller currents can still produce adequate switching fields at the location of the cell element free layer. The cell element may be formed above or below the intersecting lines, depending on the nature of the array to be fabricated.

Referring again to FIG. 1a, there is shown a vertical cross-sectional schematic view of the multi-layered MTJ cell element (50) formed above a vertically separated intersection of the ultra-thin, orthogonal word (10) and bit (20) lines of the invention. In this embodiment the cell element will be positioned above the intersection, but it can also be below the intersection. In accord with the invention, the intersecting lines are on the same side of the cell element. In horizontal cross-section, the shape of the cell is substantially circular. The two lines extend in horizontal planes, separated by between approximately 100 to 1000 angstroms, the two lines crossing over each other but insulated from each other and forming, thereby, an intersection at which the cell is located. It is understood that the vertical separation between the lines is the minimum necessary to insulate them from each other for a given insulating material, since the word line (10) should be as near as possible to the free layer of the cell. In all that follows, therefore, the term "intersection" means a vertically separated crossing of lines.

The word line (10) is directed perpendicularly out of the figure plane, the bit line (20) is within the figure plane. An additional conducting electrode, (alternatively denoted a read-word line), used in read operations (59), is formed on (and electrically contacting) an upper surface of the cell. In the operation of the cell, the conducting electrode will normally be connected (60) to an accessing transistor which is used to determine its logic state. The conducting portion of the bit line (20) can be formed as a single layer of high conductivity material such as Al, Cu, Au, Ru, Ta, CuAu, CuAg, NiCr, Rh and multilayers of these materials such as multiple laminations of (NiCr/Cu), formed to a thickness of approximately 100 nm or less and a width between approximately 300 and 5000 nm. The bit line surface distal to (furthest from) the cell free layer, the bottom surface of the bit line in this particular configuration, is covered by a layer (22) of soft (low coercivity) magnetic material with high permeability, such as alloys of Co, Ni and Fe, that has a thickness between approximately 10 and 1000 angstroms. Such a soft magnetic layer, when formed on the surface of the bit line distal to the cell, is found to concentrate the magnetic field even further. In an analogous fashion, such soft magnetic layer (12) is also formed on the lower surface of the word line, the surface distal to the cell, and it will concentrate the magnetic field of the word line. As previously noted, an additional conducting electrode (59), called a read word line, extending along the x-direction is formed electrically contacting the upper surface of the cell and is used in conjunction with the bit line (20) for read operations. A connecting line (60) goes from the electrode (59) to a terminal of an accessing transistor (not shown), which is a part of the circuitry used to determine the logic state of the MRAM cell. In the particular configuration shown in FIG. 1a, a single MRAM cell is connected to a single transistor. An array of such cells, an example of which is shown in FIG. 1b, each formed above the intersection of a word and bit line and each accessed by its own transistor, would form a particular MRAM array design.

Referring back to the cell element (50), a seed layer (51) is formed on the upper surface of the bit line (20) and promotes the high quality formation of subsequently formed layers of the cell. The seed layer can be a layer of NiCr or NiFe formed to a thickness between approximately 5 and 100 angstroms. A single pinned layer or, as in this embodiment, a synthetic ferrimagnetic pinned layer is formed on the seed layer. The synthetic layer includes an antiferromagnetic pinning layer (52), a second ferromagnetic layer (53), a coupling layer (54) and a first ferromagnetic layer (55). During layer formation, the crystalline anisotropy of the ferromagnetic layers can be set parallel to or perpendicular to the direction of the bit line for ease in their magnetization. The antiferromagnetic layer pins the magnetization of the second ferromagnetic layer unidirectionally and the first ferromagnetic layer is magnetized in an antiparallel direction to that of the first layer. The first and second ferromagnetic layers are layers of CoFe formed to thicknesses between approximately 5 and 100 angstroms and matched so that the net magnetic moment of the configuration is substantially zero. The coupling layer is a layer of Rh, Ru, Cr or Cu of proper thickness to maintain strong antiparallel coupling between the magnetic moments. The antiferromagnetic pinning layer (52) can be a layer of PtMn, NiMn, OsMn, IrMn, PtPdMn, PtCrMn or FeMn of thickness between approximately 10 and 100 angstroms.

A tunneling barrier layer (56) is formed on the first ferromagnetic layer (55) of the pinned layer. This layer is a layer of insulating material such as oxidized Al or an oxidized Al—Hf bilayer and is formed to a thickness between approximately 7 to 15 angstroms. A ferromagnetic free layer (57) is formed on the barrier layer. The free layer can be a single layer of ferromagnetic material, such as a layer of CoFe or NiFe formed to a thickness between approximately 5 and 100 angstroms or it can be a multilayer, comprising first and second ferromagnetic layers, magnetized in antiparallel directions and separated by a spacer layer of non magnetic but conducting material such as Rh, Ru, Cr or Cu, which is of the proper thickness to maintain strong antiparallel coupling between the two ferromagnetic layers. A capping layer (58) is formed on the free layer. The capping layer can be a layer of Ru, or Ta or a multilayer of Ru/Ta formed to a thickness between approximately 5 and 100 angstroms. The conducting electrode (59) is formed on the capping layer. A layer of insulating material (15) surrounds the cell and separates the word line (10) from the bit line (20). The word line (10), like the bit line, is a layer of conducting material less than 100 nm in thickness and is augmented with a magnetic field-enhancing layer (12) of magnetic material formed to a thickness between 10 and 1000 angstroms on its surface away from the cell.

Figure 1B:
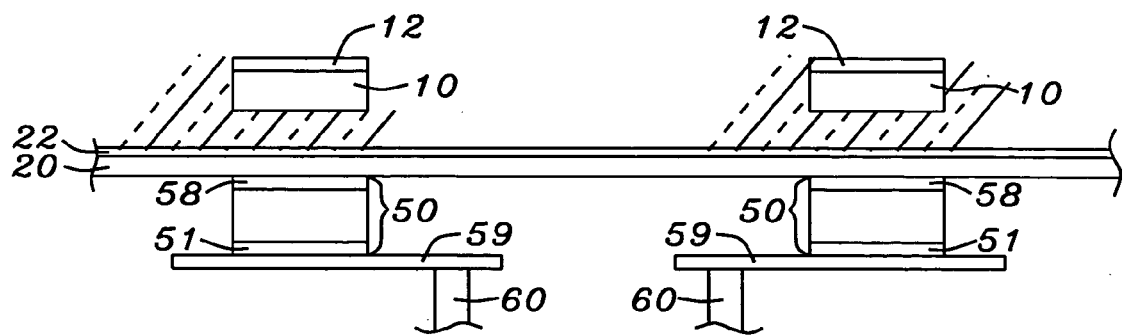
FIG. 1b is a schematic drawing of an array (two being illustrated) of MTJ MRAM cells formed beneath the ultra-thin word and bit lines of the present invention.

Referring to FIG. 1b, there is shown an array of two MRAM cells, each of the configuration of FIG. 1a, wherein each cell element (50) is formed below intersecting ultra-thin magnetically clad word (10) and bit (20) lines formed using the method of the present invention. Thus, this illustration is inverted with respect to FIG. 1a, but such an inversion is an alternative form of the invention and an embodiment thereof. The lines are clad with magnetic layers (12) and (22) and the same bit line is common to both cells but the word lines are individual. The lines are separated by between approximately 100 and 1000 angstroms and surrounded by insulating material such as $Al_2O_3$, $SiO_2$ or SiN. An electrode (59) is formed contacting the lower surface of each cell and the electrode is connected to an accessing transistor (not shown) by a conducting line (60). In this array configuration there is one transistor for each cell. It should be obvious that the array configuration could include a plurality of ultra-thin, magnetically clad bit lines and word lines and could also be formed in an inverted configuration, with the bit lines above the word lines and the lower surface of the cell element contacting the upper surface of the bit line.

Referring now to FIGS. 2a–e, there are schematically shown several of the steps involved in fabricating the bit or word lines of the present invention. The extreme thinness of the lines not only accomplishes the object of the invention, which is to provide an adequate switching field with a smaller current, but they also can be fabricated in an easier fashion than conventional thicker lines since less ion-beam etch (IBE) trimming and CMP polishing is required.

Figure 2A:
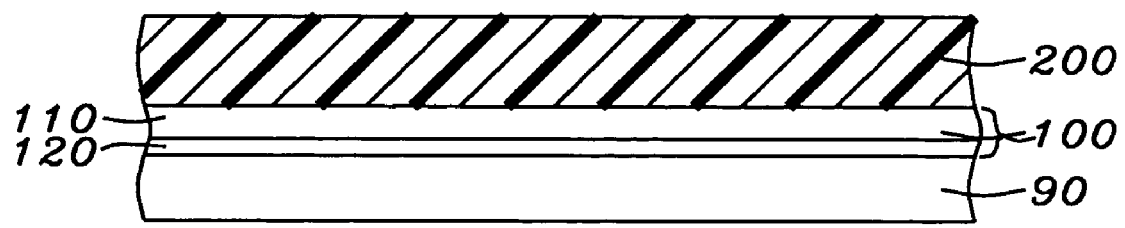
FIGS. 2a–e provide a more detailed schematic description of the formation of an ultra-thin word or bit line, indicating how the thinness of the word and bit lines makes their formation simpler.

Referring first to FIG. 2a, there are shown the first of the process steps required to form an ultra-thin word or bit line of the present invention. First a thin layer (100), which is a bi-layer of conducting (110) and magnetic (120) materials is deposited over a substrate (90) having a substantially planar upper surface, the bi-layer being deposited to the desired final thickness of the clad word or bit line by a process of sputtering, ion-beam deposition (IBD) or chemical vapor deposition (CVD). The magnetic layer of the bi-layer may be formed on an upper or a lower surface of the conducting layer, depending upon the desired final configuration, but it is shown here as a lower layer. It is noted that the substrate may be a dielectric layer that covers an already formed word or bit line, or it may be a dielectric layer that includes MTJ MRAM cell elements whose upper surfaces are co-planar with the upper surface of the dielectric. Alternatively the substrate may be a dielectric layer that does not include line or cell elements. A layer of photoresist (200) is then formed on the conducting bi-layer (100). As already noted that the bi-layer (100) is here formed as a bi-layer having a lower layer (120) contacting the substrate, the lower layer being formed of low coercivity, high permeability magnetic such as alloys of Co, Ni and Fe, that has a thickness between approximately 10 and 1000 angstroms, suitable for forming a field concentrating layer on the line to be formed. Alternatively, the upper layer of the bi-layer may be such a magnetic material. In either case, the conducting layer is a layer of Cu, Au, Al, Ag, CuAg, Ta, Cr, NiCr, NiFeCr, Ru, Rh or multiply laminated layers of said materials.

Figure 2B:
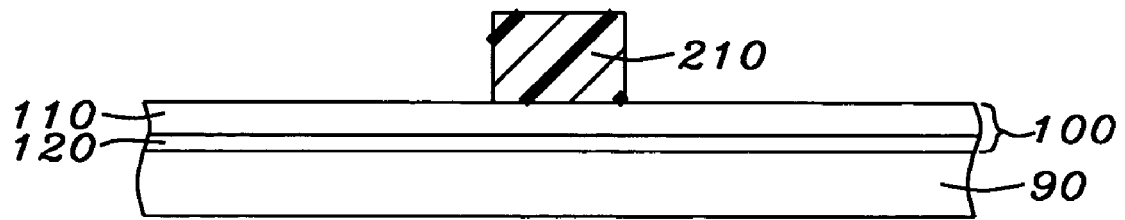

Referring to FIG. 2b, there is shown the photoresist layer now patterned (210) by a photolithographic process such as is well known in the art. The patterning produces a strip (or a plurality of parallel strips if more than one line is to be formed) that has the width of the line to be formed ($w_w$ or $w_b$) and extends in the proper line direction.

Figure 2C:
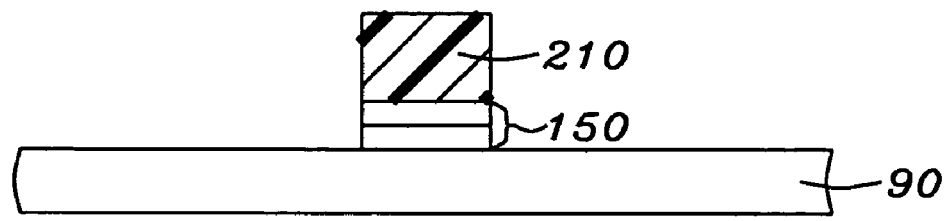

Referring to FIG. 2c, there is shown the patterned photoresist (210) having been used as a mask for an ion-beam etch (IBE) or reactive ion etch (RIE), to remove portions of the conducting layer and leave behind the desired word/bit line (150) beneath the photoresist pattern. The photoresist will then be removed (not shown) to leave only the magnetically clad word/bit lines (150) properly arranged over the substrate (90). It is noted that the substrate may be a silicon substrate, it may include the upper surfaces of MTJ capping layers or may be a dielectric substrate that contains conducting lines running orthogonally to the lines just formed.

Figure 2D:
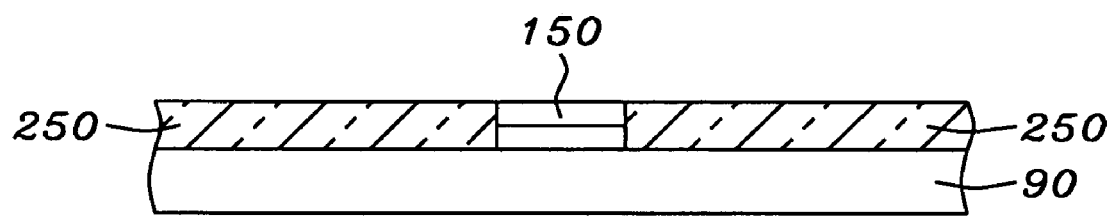

Referring to FIG. 2d, there is shown the formation of FIG. 2c wherein an insulating refill layer (250) has been deposited to fill the spaces between the word/bit lines. In this form, MTJ cells may be formed over the word/bit lines or an orthogonal set of word lines may be formed over these lines if they are bit lines. If the lines just formed (150) are bit lines (running orthogonally to the figure plane), then the orthogonal lines formed over them will be word lines (running within the figure plane).

Figure 2E:
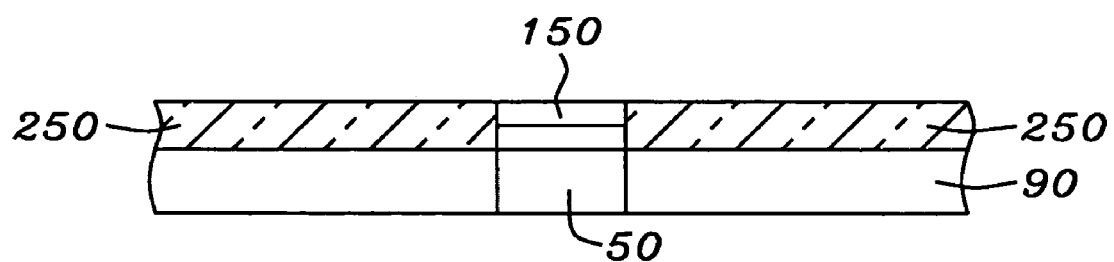

Referring finally to FIG. 2e, there is shown a substrate (90) that includes an MTJ MRAM cell (50), so that an ultra-thin bit line (150), formed in accord with FIGS. 2a–d, is positioned on the upper surface of the cell. It should be clear to one skilled in the art how other ultra-thin intersecting word/bit line configurations can be formed at the location of cell elements.

For uniformity and reproducibility it is required that the surfaces of the bit or word lines (150) not be smoothed or reduced in thickness by a process step of chemical mechanical polishing (CMP). Such polishing will introduce undesirable thickness variations in the lines that, in turn, will adversely affect the maintaining of a sufficiently small and uniform distance between the lines and the free layer within the MTJ cell. The thickness variations result because there is a difficulty in controlling the CMP lapping process and obtaining an accurate stopping point. Since CMP is therefore ruled out, the bit lines cannot be made thick, because a thick deposition will inevitably have a highly non-planar upper surface, which, without CMP, is then a cause of subsequent problems, including inaccurate photoresist patterning, poor line continuation and electro-migration. Thus, the thin deposition of the present invention eliminates the requirement of a disadvantageous CMP process and simultaneously provides the increased magnetic fields required.

As is understood by a person skilled in the art, the preferred embodiment of the present invention is illustrative of the present invention rather than being limiting of the present invention. Revisions and modifications may be made to methods, processes, materials, structures, and dimensions through which an MTJ MRAM cell element at the intersection of an ultra-thin, magnetically clad bit line and an ultra-thin magnetically clad word line is formed and provided, while still forming and providing such an MRAM cell, in accord with the present invention as defined by the appended claims.

What is claimed is:

1. An MTJ MRAM cell element formed at an intersection of ultra-thin, magnetically clad word and bit lines comprising:

an ultra-thin word line formed of magnetically clad high conductivity material, extending in a first direction within a first horizontal plane, said word line having an upper and a lower surface and having width $w_w$ and a thickness that is less than 100 nm;

an ultra-thin bit line having an upper and a lower surface, a width $w_b$ and a thickness less than 100 nm, formed of magnetically clad high conductivity material, said bit line extending in a direction orthogonal to said first direction in a second horizontal plane that is vertically separated from said first horizontal plane, wherein said bit line and said word line thereby form a vertically separated intersection and are electrically insulated from each other;

a horizontally multilayered magnetic tunnel junction (MTJ) cell element, having an upper and a lower surface and formed either above or below the intersection of said word line and said bit line and wherein said element electrically contacts said bit line.

2. The cell of claim 1 wherein the magnetic cladding on said bit line is a layer of low coercivity, high permeability magnetic material formed to a thickness between approximately 10 and 1000 angstroms on a surface of said bit line distal to said MTJ cell.

3. The cell of claim 2 wherein the magnetic cladding on said word line is a layer of low coercivity, high permeability magnetic material formed to a thickness between approximately 10 and 1000 angstroms on a surface of said word line distal to said MTJ cell.

4. The cell of claim 3 wherein said magnetic material is Co, Fe, Ni or their alloys.

5. The cell of claim 2 wherein said magnetic material is Co, Fe, Ni or their alloys.

6. The cell of claim 1 wherein either said word line is formed above said bit line and said cell is formed beneath said bit line, and wherein the upper surface of said cell electrically contacts the lower surface of said bit line, or wherein said word line is formed below said bit line and said cell is formed above said bit line and wherein a lower surface of said cell contacts the upper surface of said bit line.

7. The cell of claim 1 wherein said word line and said bit line are vertically separated by between approximately 100 and 1000 angstroms and electrically insulated from each other.

8. The cell of claim 1 wherein said high conductivity material is Cu, Au, Al, Ag, CuAg, Ta, Cr, NiCr, NiFeCr, Ru, Rh or multiply laminated layers of said materials.

9. The MTJ MRAM cell of claim 1 wherein said cell element comprises:

a seed layer formed on said bit line, an antiferromagnetic pinning layer formed on said seed layer;

a synthetic ferromagnetic pinned layer formed on said antiferromagnetic layer, said pinned layer comprising first and second ferromagnetic layers of substantially equal and opposite magnetic moments, separated by a first non-magnetic coupling layer;

an insulating tunneling barrier layer formed on said pinned layer;

a ferromagnetic free layer formed on said tunneling barrier layer;

a capping layer formed on said ferromagnetic free layer;

a conducting electrode formed of said capping layer; and wherein the magnetic anisotropy of said ferromagnetic layers is set parallel to or perpendicular to said bit line.

10. The MTJ MRAM cell of claim 9 wherein ferromagnetic free layer is a synthetic ferromagnetic layer comprising third and fourth ferromagnetic layers of substantially equal end opposite magnetic moments, separated by a second coupling layer of sufficient thickness to maintain a strong antiparallel coupling of said magnetic moments.

11. The MTJ MRAM cell of claim 9 wherein said antiferromagnetic layer is a layer of PtMn, NiMn, OsMn, IrMn, PtPdMn, PtCrMn or FeMn of thickness between approximately 10 and 500 angstroms and the ferromagnetic layers are layers of CoFe or NiFe formed to a thickness between approximately 10 and 100 angstroms and said coupling layer is a layer of Rh, Ru, Cu or Cr of sufficient thickness to maintain antiparallel coupling of the ferromagnetic layers.

12. The method of claim 1 wherein both $w_w$ and $w_b$ are between approximately 300 and 5000 nm.

13. An array of MTJ MRAM cells formed at the intersections of ultra-thin, magnetically clad word and bit lines, said array comprising:

a plurality of parallel ultra-thin word lines formed of magnetically clad high conductivity material, extending in a first direction within a first horizontal plane and having a width $w_w$ and thickness that is less than 100 nm, wherein said magnetic cladding on the word lines is formed on a lower surface of said word lines;

a plurality of parallel ultra-thin bit lines, of width $w_b$ and thickness less than 100 nm, formed of magnetically clad high conductivity material, said bit lines extending in a direction orthogonal to said first direction in a second horizontal plane that is vertically separated from and above said first horizontal plane, wherein said bit lines and said word lines thereby form an array of vertically separated intersections and are electrically insulated from each other and wherein the magnetic cladding on said bit lines is formed on a lower surface of said bit lines;

a multilayered magnetic tunnel junction (MTJ) cell element formed above each said intersection of said word line and said bit line, wherein a lower surface of said cell element electrically contacts an upper surface of said bit line;

a conducting electrode formed contacting an upper surface of each said MTJ cell element, said conducting electrode being electrically connected to an accessing transistor.

14. The array of claim 13 wherein the magnetic cladding on said bit line is a layer of low coercivity, high permeability magnetic material formed to a thickness between approximately 10 and 1000 angstroms on a surface of said bit line distal to said MTJ cell.

15. The array of claim 14 wherein said magnetic material is Co, Fe, Ni or their alloys.

16. The array of claim 13 wherein the magnetic cladding on said word line is a layer of low coercivity, high permeability magnetic material formed to a thickness between approximately 10 and 1000 angstroms on a surface of said word line distal to said MTJ cell.

17. The array of claim 16 wherein said magnetic material is Co, Fe, Ni or their alloys.

18. The array of claim 13 wherein said word line and said bit line are vertically separated by between approximately 100 and 1000 angstroms and electrically insulated from each other.

19. The array of claim 13 wherein said high conductivity material is Cu, Au, Al, Ag, CuAg, Ta, Cr, NiCr, NiFeCr, Ru, Rh or multiply laminated layers of said materials.

20. An array of MTJ MRAM cells formed at the intersections of ultra-thin, magnetically clad word and bit lines, said array comprising:

a plurality of parallel ultra-thin word lines formed of magnetically clad high conductivity material, extending in a first direction within a first horizontal plane and having a width $w_w$ and a thickness that is less than 100 nm and wherein the magnetic cladding on said word lines as formed on an upper surface of said word lines;

a plurality parallel ultra-thin bit lines, of width $w_b$ and thickness less than 100 nm, formed of magnetically clad high conductivity material, said bit lines extending in a direction orthogonal to said first direction in a second horizontal plane that is vertically separated from and below said first horizontal plane, wherein said bit lines and said word lines thereby form an array of vertically separated intersections and are electrically insulated from each other and wherein said magnetic cladding on said bit lines is formed on an upper surface of said bit lines;

a multilayered magnetic tunnel junction (MTJ) cell element formed below each said intersection of said word line and said bit line, wherein an upper surface of said cell element electrically contacts a lower surface of said bit line;

a conducting electrode formed contacting a lower surface of each said MTJ cell element, said conducting electrode being electrically connected to an accessing transistor.

21. The array of claim 20 wherein the magnetic cladding on said bit line is a layer of low coercivity, high permeability magnetic material formed to a thickness between approximately 10 and 1000 angstroms on a surface of said bit line distal to said MTJ cell.

22. The array of claim 21 wherein said magnetic material is Co, Fe, Ni or their alloys.

23. The array of claim 20 wherein the magnetic cladding on said word line is a layer of low coercivity, high permeability magnetic material formed to a thickness between approximately 10 and 1000 angstroms on a surface of said word line distal to said MTJ cell.

24. The array of claim 22 wherein said magnetic material is Co, Fe, Ni or their alloys.

25. The array of claim 20 wherein said word line and said bit line are vertically separated by between approximately 100 and 1000 angstroms and electrically insulated from each other.

26. The array of claim 20 wherein said high conductivity material is Cu, Au, Al, Ag, CuAg, Ta, Cr, NiCr, NiFeCr, Ru, Rh or multiply laminated layers of said materials.

* * * * *